United States Patent [19]

Suzuki et al.

[11] Patent Number: 5,408,692
[45] Date of Patent: Apr. 18, 1995

[54] SCANNING RECEIVER

[75] Inventors: Yoshinori Suzuki; Hironori Warabi, both of Ichikawa, Japan

[73] Assignee: Uniden Corporation, Ichikawa, Japan

[21] Appl. No.: 116,506

[22] Filed: Sep. 3, 1993

[30] Foreign Application Priority Data

Sep. 7, 1992 [JP] Japan .................................. 4-264345

[51] Int. Cl.$^6$ .............................................. H04B 1/16
[52] U.S. Cl. ............................ 455/166.1; 455/161.2; 455/186.1
[58] Field of Search ............... 455/161.1, 161.2, 166.1, 455/166.2, 185.1, 186.1, 186.2

[56] References Cited

U.S. PATENT DOCUMENTS

| 4,495,654 | 1/1985 | Deiss | 455/151 |
| 4,731,654 | 3/1988 | Itabashi et al. | 358/188 |
| 5,103,314 | 4/1992 | Kennan | 358/193.1 |

FOREIGN PATENT DOCUMENTS 3928145 2/1991 Germany .

*Primary Examiner*—Reinhard J. Eisenzopf
*Assistant Examiner*—Chi H. Pham
*Attorney, Agent, or Firm*—Kanesaka & Takeuchi

[57] ABSTRACT

A scanning receiver is formed of a memory for storing reception frequencies corresponding to a plurality of reception channels; a receiving section for receiving radio waves to be tuned to the reception frequencies; a control device for controlling the memory and the receiving section so as to read out the reception frequencies corresponding to the reception channels successively in a predetermined order from the memory in predetermined order to thereby cause the receiving section to operate. The memory including a fixed storage portion in which parts of the reception frequencies are fixedly written and an additional storage portion in which parts of the reception frequencies are rewritably written, the additional storage portion including a select/non-select setting area in which select/non-select information is written, the select/non-select information indicating that when the reception frequencies corresponding to the reception channels are read out from the fixed and additional storage portions, the reading out of each of the reception frequencies is necessary or not.

4 Claims, 3 Drawing Sheets

SCANNING RECEIVER

BACKGROUND OF THE INVENTION

The present invention generally relates to a scanning receiver, and particularly relates to a scanning receiver having a large number of channel memories.

Scanning receivers now available on the market have channel memories for channels in a range of from about 10 channels to about 200 channels.

Reception frequencies corresponding to reception channels are stored in the respective channel memories. In reception, the reception frequencies are read in a predetermined order by means of a microcomputer so that radio waves tuned to the reception frequencies are received.

In this case, the receiving methods are largely grouped into two, one being a method in which reception is made successively with the reception frequencies registered by a user in the respective channel memories, the other being a method in which reception is made successively with the reception frequencies registered as fixed frequencies by a manufacturer when the receiver is forwarded from a factory.

Therefore, in order to receive both the frequencies registered by a user and the frequencies registered by a manufacturer alternately, it is necessary for the user to perform a change-over operation every time. Further, there has been a defect that the fixed frequencies registered by a manufacturer cannot be made invalid even if any of the fixed frequencies is not necessary.

SUMMARY OF THE INVENTION

It is therefore an object of the present invention to provide a scanning receiver in which the foregoing defect in the conventional art can be eliminated.

In order to attain the above object, according to the present invention, the scanning receiver comprises: a memory for storing reception frequencies corresponding to a plurality of reception channels; a receiving section for receiving radio waves to be tuned to the reception frequencies; a control means for controlling the memory and the receiving section so as to read out the reception frequencies corresponding to the reception channels successively in a predetermined order from the memory in predetermined order to thereby cause the receiving section to operate, the memory including a fixed storage portion in which parts of the reception frequencies are fixedly written and an additional storage portion in which parts of the reception frequencies are rewritable written, the additional storage portion including a select/non-select setting area in which select/non-select information is written, the select/non-select information indicating that when the reception frequencies corresponding to the reception channels are read out from the fixed and additional storage portions, the reading out of each of the reception frequencies is necessary or not.

Preferably, the fixed storage portion is constituted by read only memories and the additional storage portion is constituted by random access memories.

Desired reception frequencies are set by a user in the additional storage portion. Further, the select/non-select information as to whether reception of any of the reception frequencies is necessary or not is set in the select/non-select setting area. As a result, of the reception frequencies registered in the fixed and additional storage portions, only those selected are successively read out to thereby carry out the reception.

DETAILED DESCRIPTION OF THE PREFERRED EMBODIMENT

Figure 1:
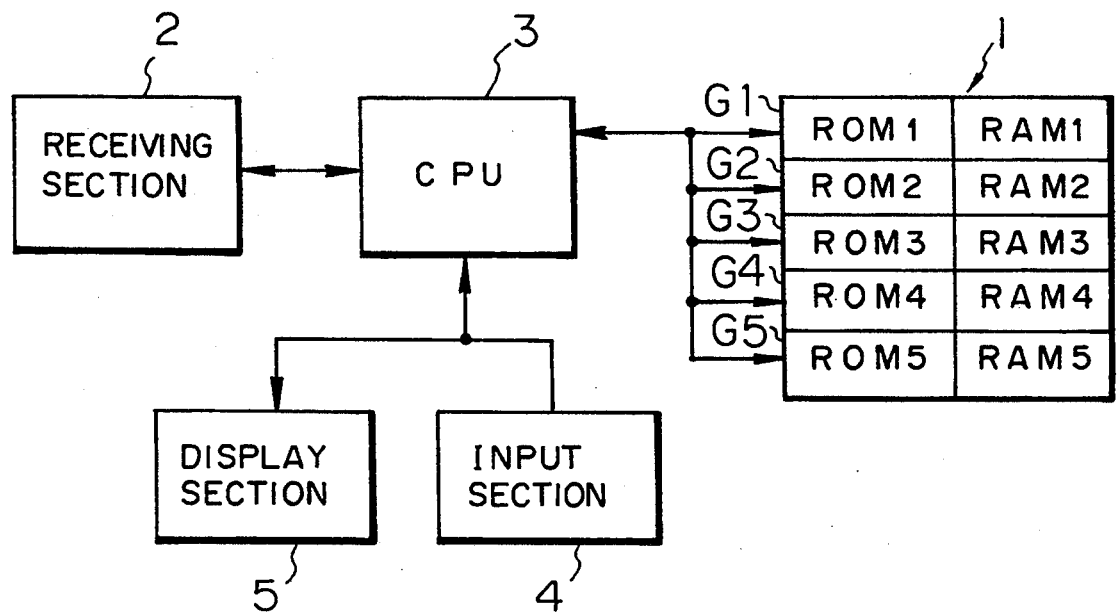
FIG. 1 is a block diagram schematically showing an embodiment of the present invention.

Next, an embodiment of the present invention will be described with reference to the accompanying drawings. FIG. 1 is a block diagram schematically showing the scanning receiver according to the present invention. In this embodiment, the scanning receiver has a memory 1 in which reception frequencies are stored, a receiving section 2 for receiving radio waves respectively tuned to the reception frequencies, a central processing unit (CPU) 3 functioning as a control means for controlling the memory 1 and the receiving section 2, an operating keyboard 4, and a display section 5 constituted by LEDs, LCDs, or the like.

In this embodiment, the memory 1 is divided into groups G1 through G5 in accordance with the use. For example, the groups G1, G2, G3, G4 and G5 are assigned to police radio, fire fighting and emergency radio, aircraft radio, weather forecast broadcasting, and marine craft radio, respectively.

The group G1 has ROM (read only memory) 1 and RAM (random access memory) 1, the group G2 has ROM 2 and RAM 2, the group G3 has ROM 3 and RAM 3, the group G4 has ROM 4 and RAM 4, and the group G5 has a pair of ROM 5 and RAM 5.

Figure 2:
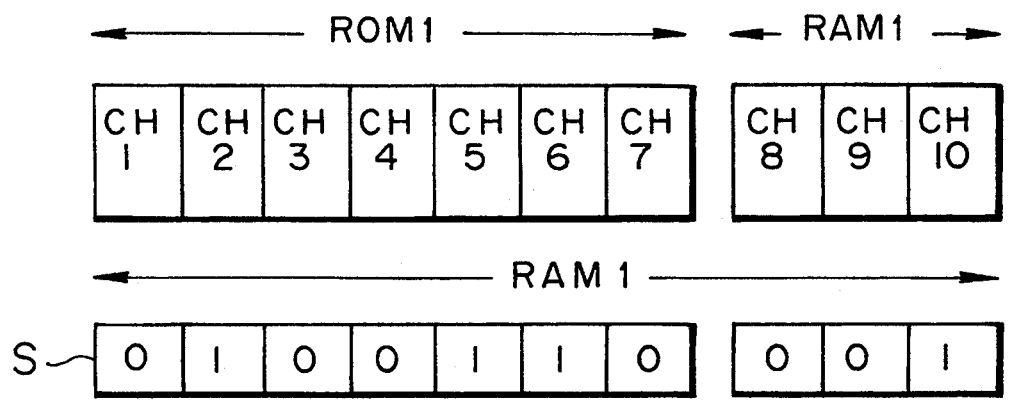
FIG. 2 is a diagram typically showing a combination of ROM and RAM belonging to each of groups.

Referring to FIG. 2, now, the combination of ROM 1 and RAM 1 constituting the group G1 will be described by way of example.

In this embodiment, each of the groups G1 through G5 has 10 reception channels. In the illustrated case, the channels CH1 through CH7 are assigned to ROM 1 and the residual channels CH8 through CH10 are assigned to the RAM 1.

Further, a select/non-select setting area S for allowing only the necessary channels to be received is provided in the RAM 1. That is, 10 storage domains respectively corresponding to the ten channels CH1 through CH10 are allotted in the select/non-select setting area S. In each of the ten domains, "0" or "1" is written to control the reading of the reception frequency of controlled.

In this embodiment, "0" represents necessity of reading while "1" represents un-necessity of reading. Therefore, in the illustrated case of FIG. 2, reading of reception is carried out successively in the order of the channels CH1, CH3, CH4, CH7, CH8, and CH9, while the channels CH2, CH5, CH6, and CH10 are not read.

Further, reception frequencies are registered in advance in the channels CH1 through CH7 of the ROM 1 in the manufacture's side, for example, at the time of forwarding from a factory, and, on the contrary, a user can temporarily write desired reception frequencies into the respective channels CH8 through CH10 in the RAM 1. Writing into the RAM 1 may be performed from the keyboard 4 through the CPU 3.

The receiving section 2 includes an RF (radio frequency) section, an AF (audio frequency) section, and a PLL (phase locked loop) circuit although those members are not illustrated in detail, and receives radio waves tuned to the reception frequencies to be read from the memory 1.

Figure 3:
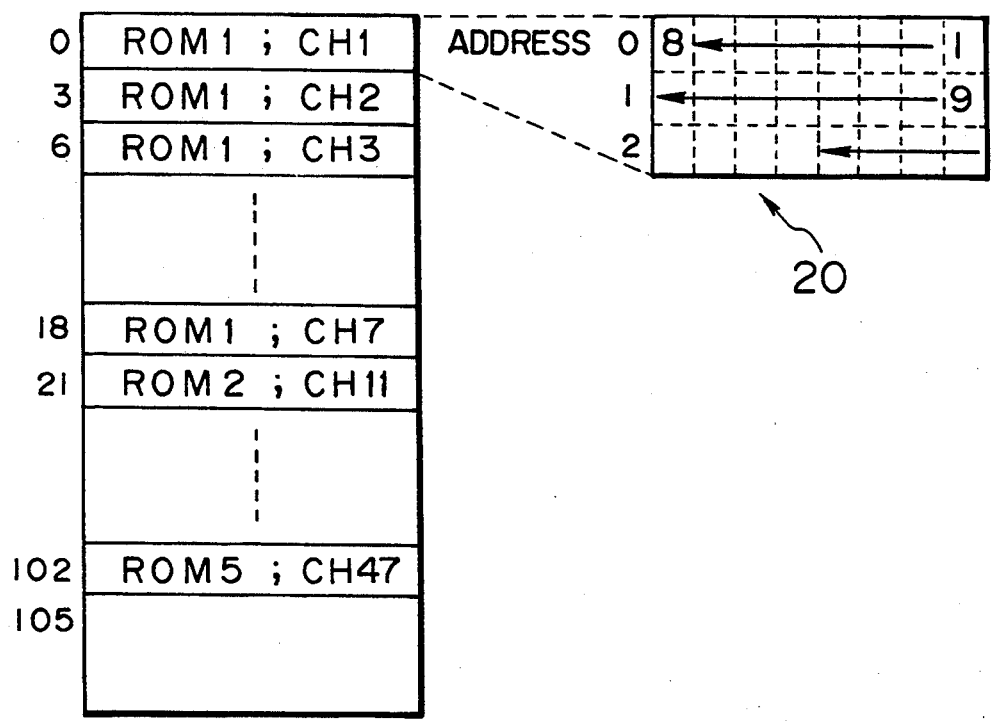
FIG. 3 is a diagram for explaining a memory map of ROM.

Next, referring to a memory map of FIG. 3, description will be made as to a state where data are written into the ROM. Although reception frequency data are constituted by 20 bits for every channel. The actual frequency data are constituted by 16 bits and the residual 4 bits (MSB side) are assigned for controlling the peripheral circuits.

In the illustrated embodiment, an 8-bit ROM is employed and 3 bites thereof are allotted per channel because the reception frequency data are allotted with 20 bits for every channel. Accordingly, 105 bites (address 0-address 104) are required for registration of 35 channels (7 channels for each of 5 groups, that is, from CH1 of the group G1 to CH7 of the group G5) and the addresses 105 et seq are used other programs.

Figure 4:
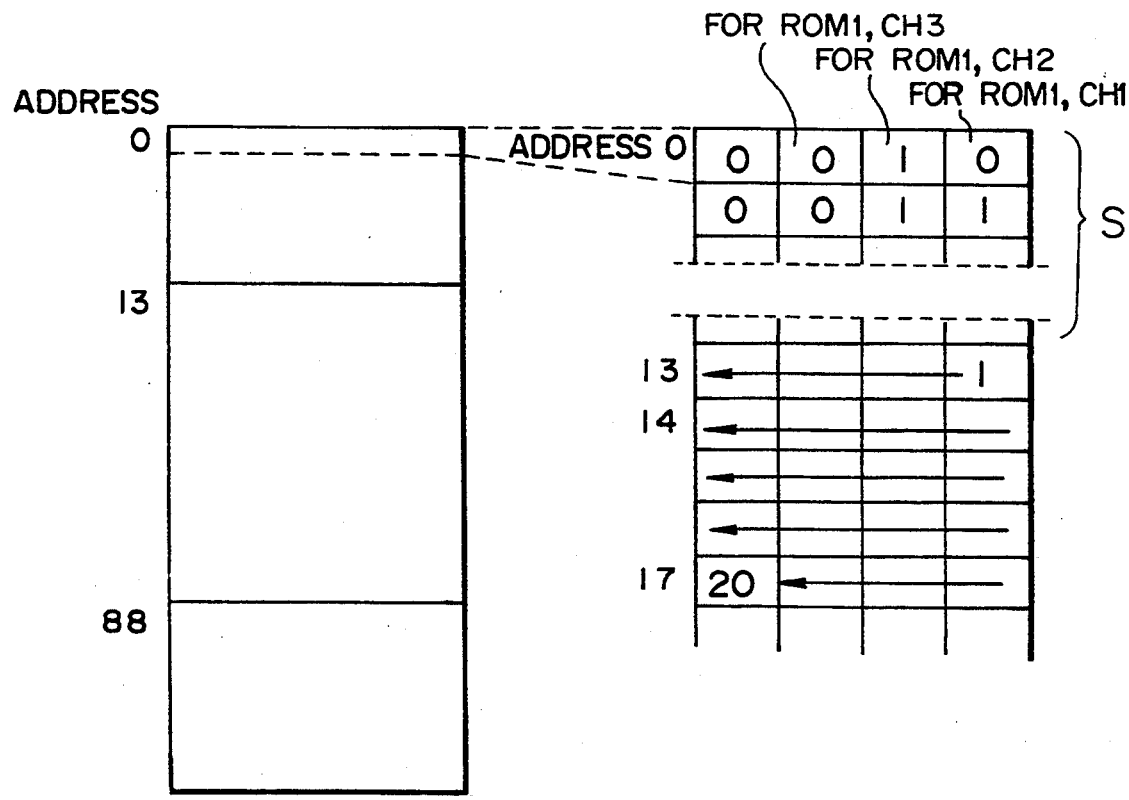
FIG. 4 is a diagram for explaining a memory map of RAM.

FIG. 4 shows the memory map of the RAM. In the illustrated embodiment, since a 4-bit CPU is employed as the CPU 3, the RAM has a configuration in which 4 bits are prepared per address.

First, the select/non-select setting area S is set in the RAM. In the illustrated embodiment, since the total of the channels of the five groups from G1 to G5 is 50, 50 bits or 12.5 (=50 ÷4) are required for the registration of select/non-select setting for all the 50 channels. That is, the LSB is allotted for the select/non-select setting of the channel CH1 of ROM 1, the second bit is allotted to the channel CH2 of ROM 1, . . . , and the MSB is allotted to the channel CH10 of ROM 5.

The reception frequency data of the channel CH8 of the RAM 1 are written in the 13th address et seq. That is, 5 bites are required for the registration of the channel CH8 of the RAM 1 because the reception frequency data for each channel are constituted by 20 bits.

After writing of the channel CH8 of the RAM 1, the reception frequency data for the channels CH9 and CH10 of the RAM 1 are written. Thereafter, the reception frequency data of the channels CH8–CH10 of the RAM 2, . . . the reception frequency data of the channels CH8–CH10 of the RAM 5 are successively written. The thus written reception frequency data in the RAM can be rewritten if necessary.

Figure 5:
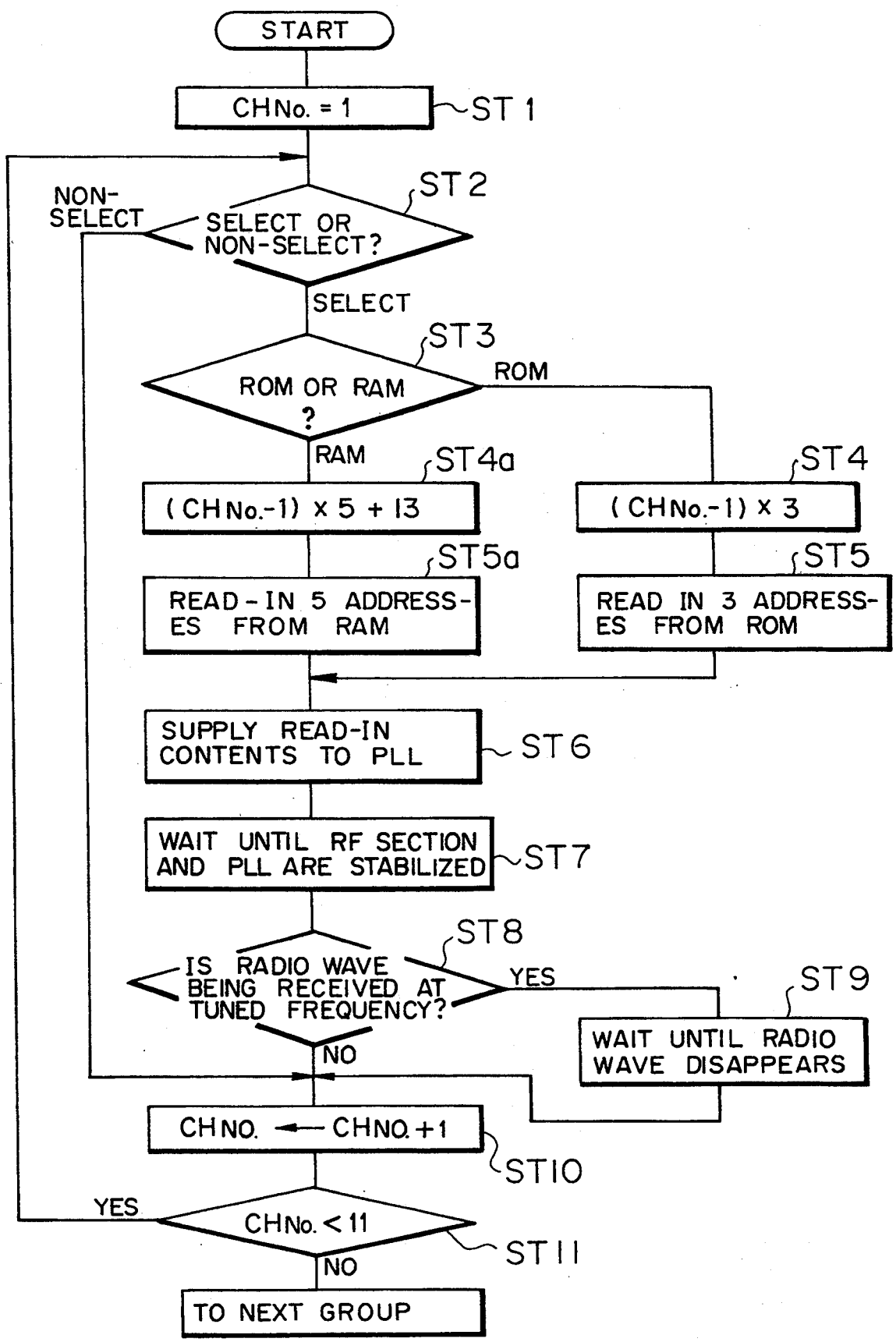
FIG. 5 is a flowchart of subroutine for explaining the operation for reading out data from channel memories.

Next, description will be made as to the operation for reading out the reception frequency data with respect to the groups G1 through G5 in accordance with the subroutine of FIG. 5. It is assumed that scanning is performed from the group G1 for the sake of convenience in explanation.

First, the first channel CH1 of the group G1 is designated as the channel number 1 in the first step ST1. Then, judgment is made as to whether the channel CH1 is selected or not in the next step ST2. That is, it is detected which one of "0" and "1" has been written in the LSB of the RAM corresponding to the channel CH1 of the group G1, and if "0" is detected, it is judged that the channel CH1 of the group 1 is selected so that the operation is shifted to the next step ST3.

Judgment is made in the step ST3 as to whether the channel CH1 of the group 1 is written in the ROM or the RAM. This is judged on the basis of the surplus obtained by dividing the channel number by 10, because each group has 10 channels in which the first to seventh channels are registered in the ROM and the eighth to tenth channels are registered in the RAM in the illustrated embodiment. Accordingly, if the surplus is ranged from 1 to 7, it is concluded that the channel is written in the ROM, while if the surplus is 8, 9, or 10, it is concluded that the channel is written in the RAM. This applies to the case where all the channels of the groups G1 to G5 are serially numbered.

Since the channel number is now "1", the surplus is "1" and the ROM is determined, and the address corresponding to the channel CH1 is designated in the step ST4. Subsequently, in the step ST5, the reception frequency data are read out on the base of the three addresses including the designated address in the step ST5.

Then, in the step ST6 the read-out reception frequency data are supplied to the PLL circuit of the receiving section 2, so that the receiving circuit is tuned to the aimed frequency and the other circuits are changed over in accordance with the reception frequency.

After the RF section and PLL circuit has been stabilized (for about 20 to 100 msec) in the step ST7, judgment is made as to whether a radio wave is received or not at the tuned frequency in the step ST8. In this case, if the tuned frequency is received, the contents of reception such as aural information or the like are outputted from a speaker through the AF section. The reception state is held until the radio wave input disappears in the step ST9.

In the case where the radio wave input is interrupted for a predetermined time in the step ST9 or in the case where the aimed radio wave cannot be received in the step ST8, "1" is added in the step ST10 to the channel number to make the channel be "2". Then, the new channel number is compared with "11" in the step ST11, and the operation is returned to the step ST2 because the channel number is smaller than "11" in this case.

Thus, the channel CH is successively incrementally designated, and if the channel number reaches "8", the RAM is determined in the step ST3. As a result, in the step ST4a, the address corresponding to the channel CH8 is designated, the next reception frequency data are read on the basis of 5 addresses including the designated address. The steps ST6 et seq. are executed in the same manner as in the foregoing case.

In the illustrated embodiment, "1" has been written as the select/non-select information with respect to each of the channels CH2, CH5, CH6, and CH10, and in the step ST2, it is concluded that the channels CH2, CH5, CH6, and CH10 are not selected in the step ST2 in this case. The operation is shifted to the step ST10 without reading the reception frequency data thereof, that is, while making jump over the steps ST3 through 8.

Then, when "1" is added to the channel number so that the new channel number becomes "11" in the step ST10, NO is selected in the step ST11 and scanning is performed with respect to the next group G2. Thereafter, the operation is repeated till the step operation is performed.

Although the memory is divided into 5 groups each of which is constituted by 10 channels in the foregoing embodiment, the present invention is not limited to this, and the number of the groups and the number of the channels may be set desirably.

Further, although each of the ROM and RAM is divided into five groups in FIG. 1, this division is merely for the sake of convenience in explanation, and in practice, a one-chip microcomputer including the CPU 3 is used.

As described above, according to the present invention, the ROM and RAM are formed so as to constitute a series of channel memory. Consequently, reception frequency data fixed in the ROM and reception frequency data additionally registered by a user in the RAM can be successively serially read without requiring any manual operation by the user.

Further, by writing select/non-select information, it is possible to perform temporary deletion of a frequency registered in the ROM and it is possible to easily perform addition of a new frequency and to conveniently carry out the scanning reception.

What is claimed is:

1. A scanning receiver for monitoring a plurality of frequency channels in sequence, comprising:
   a read only memory for storing information of at least one first frequency channel and having an address location therein for the first frequency channel, said address location having a specific channel number assigned to said first frequency channel;
   a random access memory for storing information of at least one second frequency channel and select/non-select information for the respective first and second frequency channels, said random access memory having an address location therein for the second frequency channel, said address location having a specific channel number assigned to said second frequency channel;
   controlling means for sequentially selecting one of said specific channel numbers in the read only memory and the random access memory, said control means checking the select/non-select information for the channel numbers, and when one specific channel is to be read by the select/non-select information, reading out said information of the selected channel number stored in said address location to find if a radio wave is received, said controlling means allowing the selected channel number to pass for selecting another of said specific channel numbers if the radio wave is not received for at least a predetermined time, said control means, in case said selected channel number has non-select information at the random access memory, skipping said selected channel number, and
   a receiving section for receiving the radio wave based on the information of the selected channel number determined at said controlling means.

2. A scanning receiver according to claim 1, wherein said read only memory is registered with said first frequency channel information at a time of manufacturing.

3. A scanning receiver according to claim 2, wherein said random access memory is registered with said second frequency channel information by a user.

4. A method of operating a scanning receiver comprising:
   storing in a read only memory information of at least one first frequency channel therein, said at least one first frequency channel information being stored in an address location within said read only memory, said address location having a channel number assigned to said at least one first frequency channels;
   storing in a random access memory information of at least one second frequency channel therein and select/non-select information for the respective first and second frequency channels, said at least one second frequency channel information being stored in an address location within said random access memory, said address location having a channel number assigned to said at least one second frequency channels;
   selecting sequentially one of said channel numbers in the read only memory and the random access memory by controlling means, said control means checking the select/non-select information for the channel numbers and when one channel is to be read by the select/non-select information, reading out said information of the selected channel number stored in said address location to find if a radio wave is received, said controlling means allowing the selected channel number to pass for selecting another of said specific channel numbers if the radio wave is not received for at least a predetermined time, said control means, in case said selected channel number has non-select information at the random access memory, skipping said selected channel number; and
   receiving the radio wave based on the information of the selected channel number determined at said controlling means.

* * * * *